(12) United States Patent
Vettori

(10) Patent No.: US 12,259,407 B2
(45) Date of Patent: Mar. 25, 2025

(54) CONTACT PROBE FOR PROBE HEADS OF ELECTRONIC DEVICES

(71) Applicant: TECHNOPROBE S.P.A., Cernusco Lombardone (IT)

(72) Inventor: Riccardo Vettori, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 83 days.

(21) Appl. No.: 18/040,336

(22) PCT Filed: Aug. 3, 2021

(86) PCT No.: PCT/EP2021/071676
§ 371 (c)(1),
(2) Date: Feb. 2, 2023

(87) PCT Pub. No.: WO2022/029126
PCT Pub. Date: Feb. 10, 2022

(65) Prior Publication Data
US 2023/0314476 A1 Oct. 5, 2023

(30) Foreign Application Priority Data
Aug. 4, 2020 (IT) .................. 102020000019126

(51) Int. Cl.
*G01R 1/067* (2006.01)
*G01R 1/073* (2006.01)

(52) U.S. Cl.
CPC ..... *G01R 1/06738* (2013.01); *G01R 1/06716* (2013.01); *G01R 1/07357* (2013.01)

(58) Field of Classification Search
CPC ............ G01R 1/06738; G01R 1/06716; G01R 1/07357; G01R 1/06733
See application file for complete search history.

(56) References Cited

U.S. PATENT DOCUMENTS

| 7,850,460 B2 | 12/2010 | Weiland et al. |
| 2010/0219854 A1 | 9/2010 | Kuniyoshi et al. |

(Continued)

FOREIGN PATENT DOCUMENTS

| CN | 108593980 A | 9/2018 |
| CN | 109425763 A | 3/2019 |

(Continued)

OTHER PUBLICATIONS

International Search Report and Written Opinion for Corresponding International Application No. PCT/EP2021/071676 (11 Pages) (Sep. 10, 2021).

*Primary Examiner* — G.M. A Hyder
(74) *Attorney, Agent, or Firm* — LUCAS & MERCANTI, LLP

(57) ABSTRACT

A contact probe having a first end portion adapted to abut onto a contact pad of a device under test and a second end portion adapted to abut onto a contact pad of a PCB board of a testing apparatus, as well as a rod-shaped probe body extended between the end portions along a longitudinal development direction is provided with an opening extending along the longitudinal development direction and defines at least one pair of arms in the probe body. Suitably, each arm of the at least one pair of arms has a not constant transversal section, which is perpendicular to the longitudinal development direction, having different areas in correspondence of different points along the probe body and ensures a distribution of the stress along the probe body during bending thereof during testing operation of the device under test performed by means of the contact probe.

25 Claims, 10 Drawing Sheets

(56) References Cited

U.S. PATENT DOCUMENTS

| | | | | |
|---|---|---|---|---|
| 2012/0071037 A1* | 3/2012 | Balucani | ............... | H01R 12/714 257/E21.585 |
| 2015/0280345 A1 | 10/2015 | Kimura et al. | | |
| 2017/0115324 A1* | 4/2017 | Teranishi | .............. | G01R 1/0483 |
| 2017/0122983 A1* | 5/2017 | Acconcia | ........... | G01R 1/07357 |
| 2017/0269125 A1* | 9/2017 | Crippa | ............... | G01R 1/06761 |
| 2018/0003767 A1* | 1/2018 | Crippa | ............... | G01R 1/07357 |
| 2018/0011126 A1* | 1/2018 | Acconcia | ........... | G01R 1/06733 |
| 2019/0041430 A1* | 2/2019 | Park | .................... | G01R 1/06738 |
| 2020/0233014 A1* | 7/2020 | Lee | .................... | G01R 31/2831 |
| 2020/0348336 A1* | 11/2020 | Vettori | ............... | G01R 31/2886 |
| 2023/0029150 A1* | 1/2023 | Crippa | ............... | G01R 1/06738 |
| 2024/0027495 A1* | 1/2024 | Vettori | ............... | G01R 1/06738 |

FOREIGN PATENT DOCUMENTS

| | | |
|---|---|---|
| DE | 102013011968 A1 | 2/2015 |
| DE | 102017209441 A1 | 12/2018 |
| EP | 3268751 A1 | 1/2018 |
| WO | 2016146476 A1 | 9/2016 |

* cited by examiner

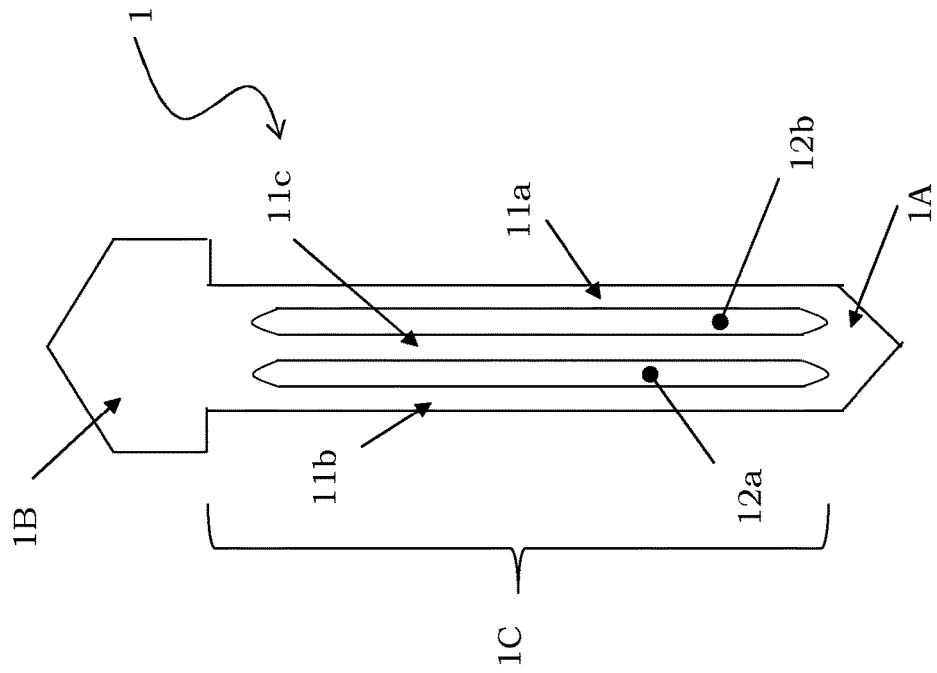
FIG. 2B
PRIOR ART
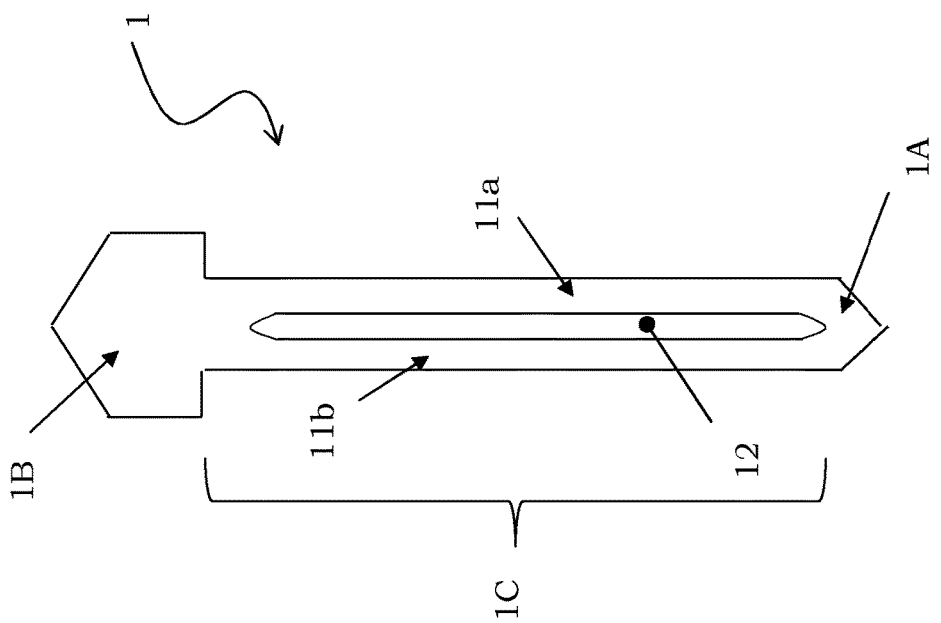
FIG. 2A
PRIOR ART
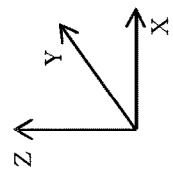

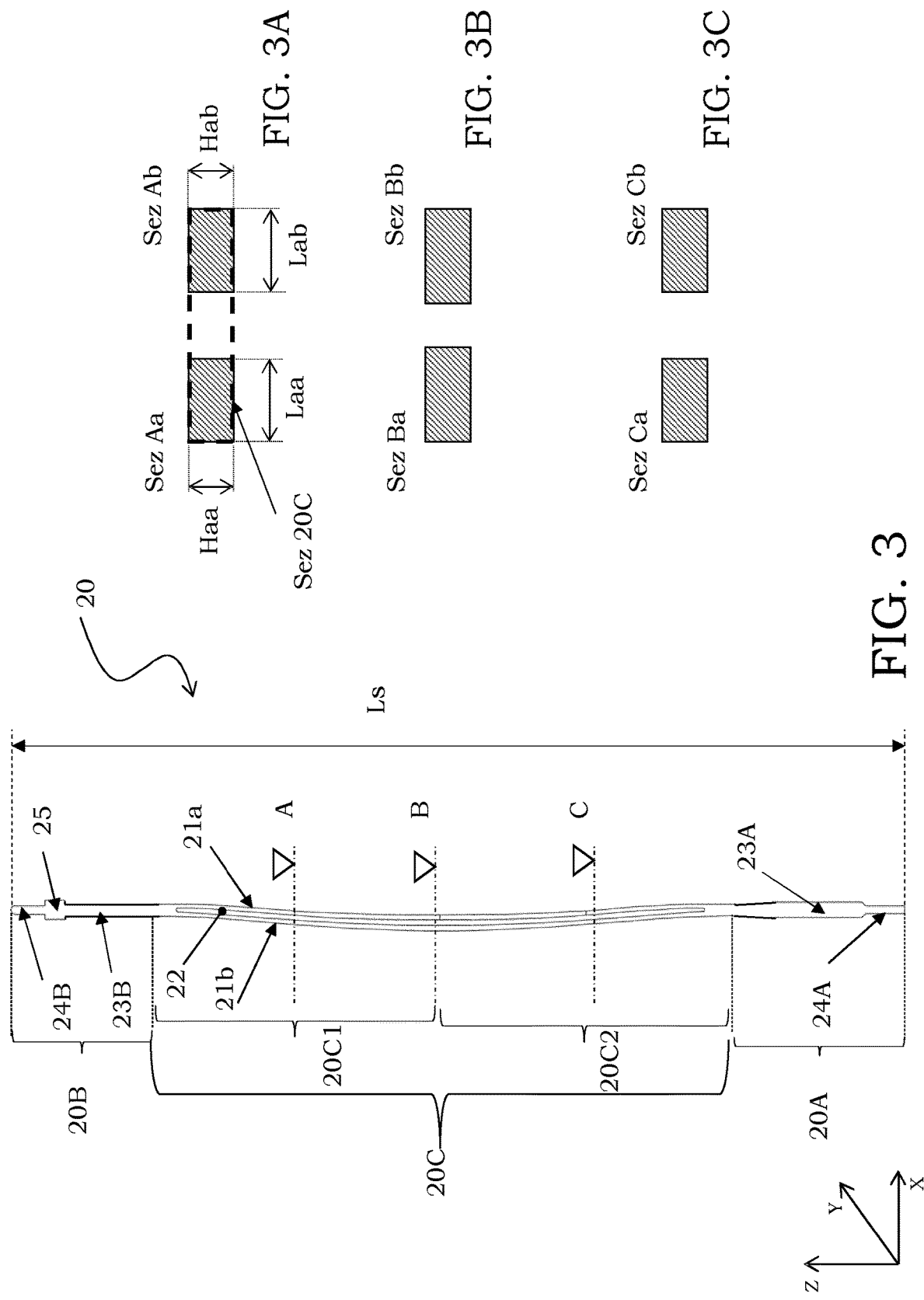

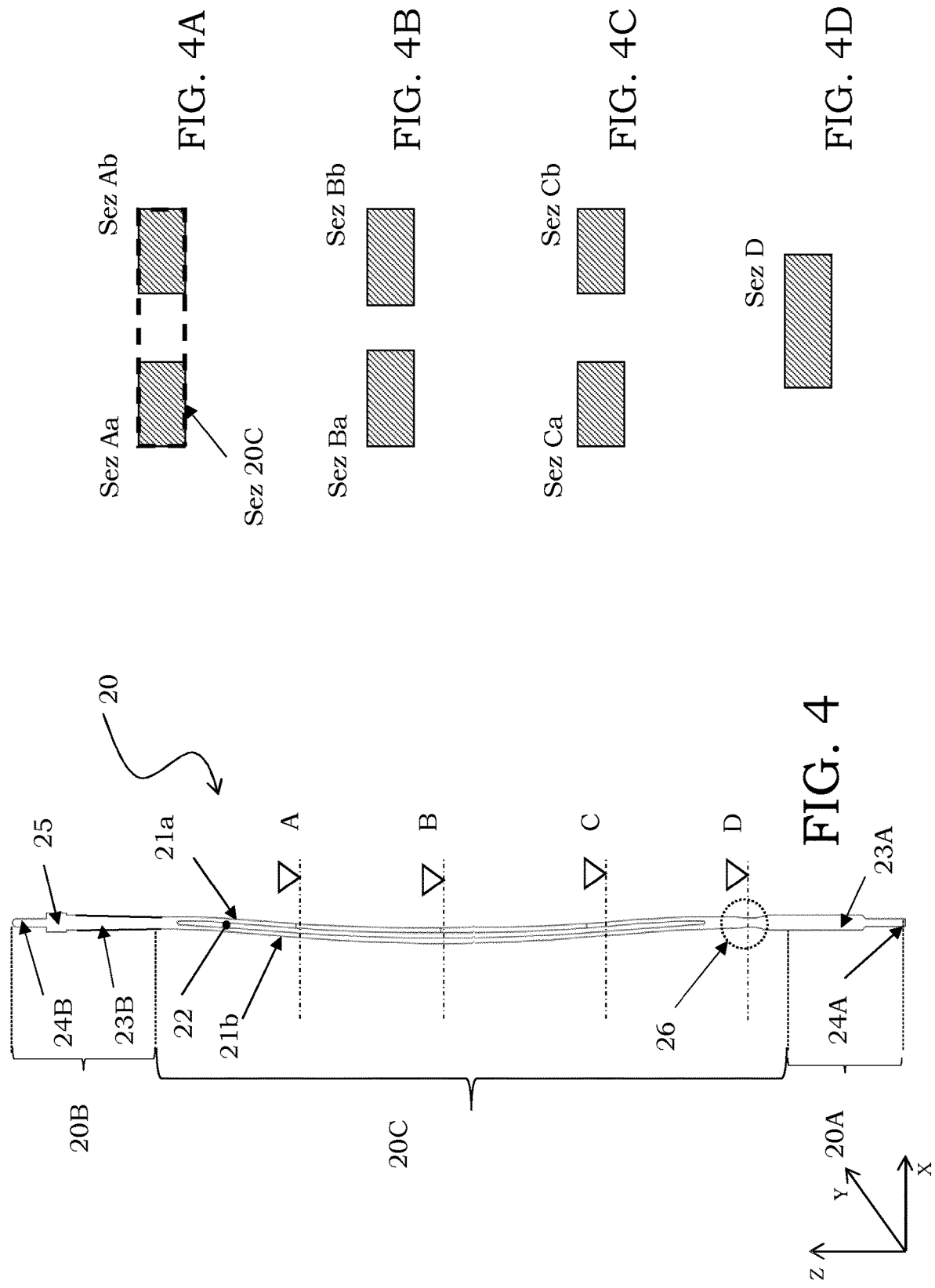

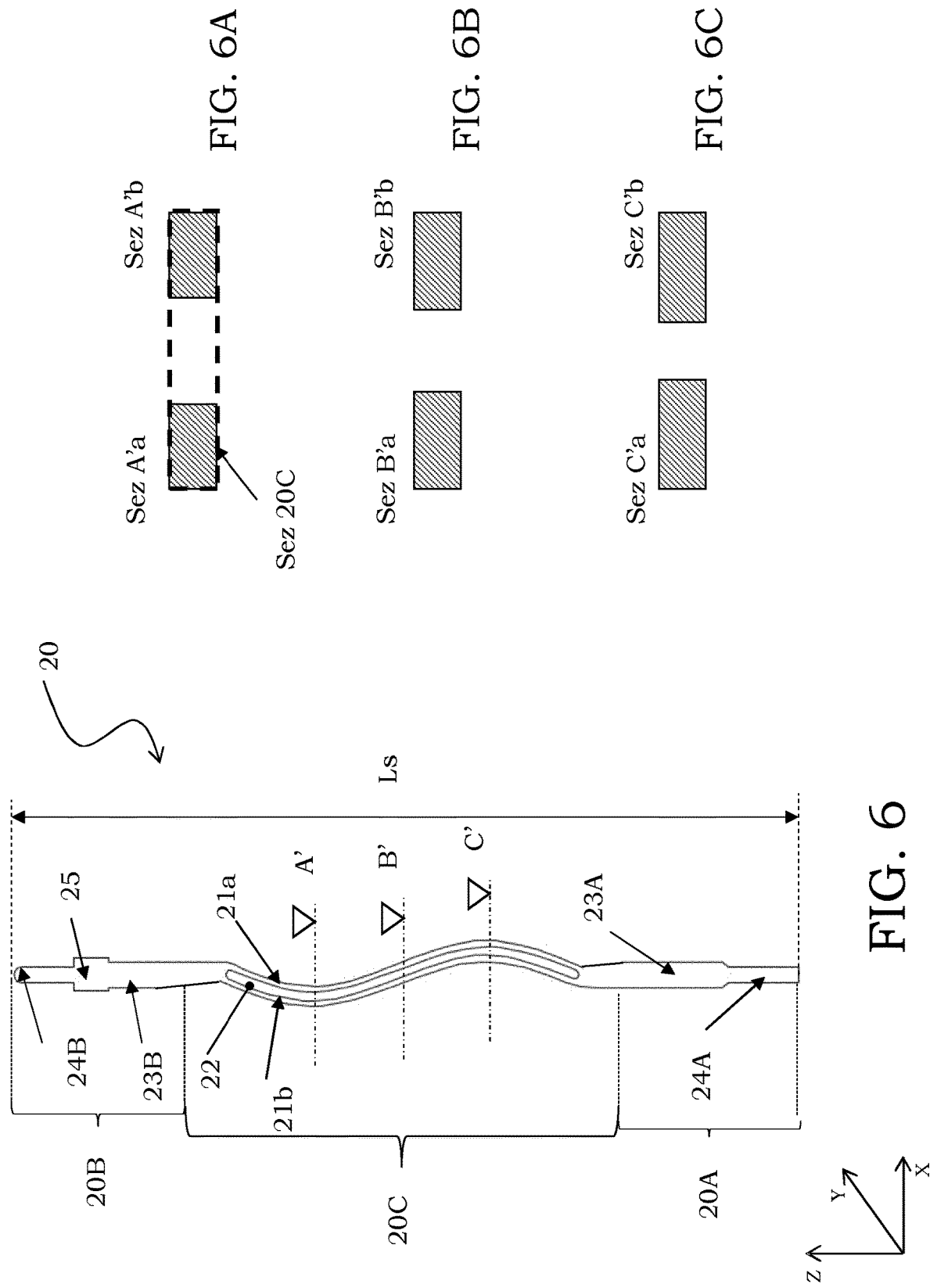

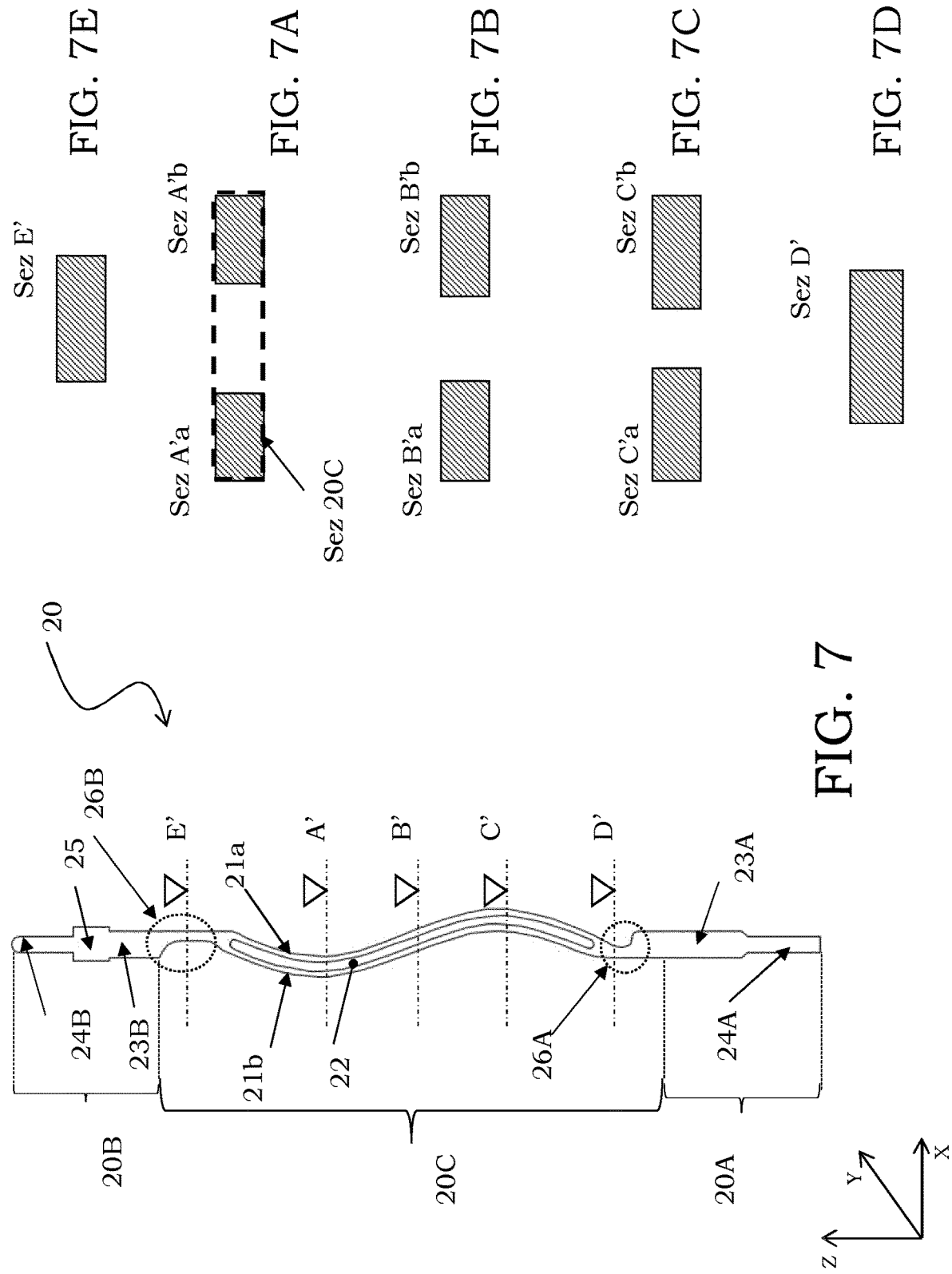

CONTACT PROBE FOR PROBE HEADS OF ELECTRONIC DEVICES

CROSS-REFERENCE TO RELATED APPLICATIONS

This application is a 371 of PCT/EP2021/071676, filed Aug. 3, 2021, which claims the benefit of Italian Patent Application No. 102020000019126, filed Aug. 4, 2020.

TECHNICAL FIELD

The present invention relates, in its more general aspect, to a contact probe for a probe head of electronic devices and the following description is made with reference to this field of application with the sole aim of simplifying the exposure thereof.

BACKGROUND OF THE INVENTION

As it is well known, a probe head is essentially a device adapted to electrically connect a plurality of contact pads of a microstructure, in particular an electronic device that is integrated on a wafer, with corresponding channels of a testing apparatus that performs the functionality testing thereof, in particular electric, or generically the test.

The test, which is performed on electronic integrated devices, is particularly useful for detecting and isolating defective devices as early as in the production phase. Usually, probe heads are therefore used for the electric test of devices integrated on a wafer before cutting and assembling them inside a chip containment package.

A probe head usually comprises a high number of contact elements or contact probes formed by wires of special alloys with good electric and mechanical properties and provided with at least one contact portion for one of the contact pads of the device under test.

A probe head of the type commonly called "vertical probe head" comprises a plurality of contact probes usually held by at least one pair of plates or guides which are substantially plate-shaped and parallel to each other. Said guides are provided with suitable holes and are arranged at a certain distance from each other in order to leave a free space or air gap for the movement and possible deformation of the contact probes. The pair of guides comprises in particular an upper guide, placed closer to the testing apparatus comprising the probe head, and a lower guide, placed closer to a wafer comprising the devices under test, both guides being provided with respective guide holes within which the contact probes axially slide.

The good connection between the contact probes of the probe head and the contact pads of the device under test is ensured by the pressure of the probe head on the device itself, the contact probes, which are movable within the guide holes formed in the upper and lower guides, undergoing, during said pressing contact, a bending inside the air gap between the two guides and a sliding inside the corresponding guide holes.

Furthermore, the bending of the contact probes in the air gap may be facilitated through a suitable configuration of the probes themselves or of the guides thereof, as schematically illustrated in FIG. 1, where, for simplicity of illustration, only one contact probe of the plurality of probes usually comprised in a probe head has been illustrated, the probe head illustrated being of the so-called type of probe head with shifted plates.

In particular, FIG. 1 schematically illustrates a probe head 10 comprising at least one upper plate or die 2 and one lower plate or die 3, having respective upper guide holes 2A and lower guide holes 3A within which at least one contact probe 1 slides, having a probe body 1C essentially extended in a longitudinal development direction according to the HH axis indicated in the figure. A plurality of contact probes 1 is usually placed inside the probe head 10 with said longitudinal development direction arranged orthogonally to the device under test and to the guides, i.e. substantially vertically along the x axis of the local reference of the figure.

The contact probe 1 has at least one end or contact tip 1A. The terms end or tip indicate herein and in the following an end portion, which is not necessarily pointed. In particular, the contact tip 1A abuts onto a contact pad 4A of a device under test 4, performing the mechanical and electric contact between said device under test and a testing apparatus (not represented) which said probe head 10 forms an end element thereof. In some cases, the contact probes are fixedly fastened to the probe head, for instance at the upper guide: such probe heads are referred to as "blocked probe heads".

Alternatively, probe heads are used with not fixedly fastened contact probes but held interfaced to a PCB board of the testing apparatus: such probe heads are referred to as "unblocked probe heads". Usually, in this case the probe head also comprises a so-called "space transformer", interposed between the probe head and the testing apparatus and able to spatially redistributing the contact pads realized thereon with respect to the contact pads on the device under test, in particular relaxing the distance constraints between the centers of the pads themselves, namely with a space transformation in terms of distances between the centers of adjacent pads, usually indicated as pitches.

In this case, as illustrated in FIG. 1, the contact probe 1 has a further contact end 1B, usually indicated as contact head, towards a plurality of contact pads 5A of said space transformer 5. The proper electric connection between probes and space transformer 5 is ensured analogously to the contact with the device under test 4 by the pressure of the contact heads 1B of the contact probes 1 onto the contact pads 5A of the space transformer 5. More generally, the contact pads whereonto the contact heads 1B of the probes abut may be made directly on a PCB board of the testing apparatus used for the connection with the probe head 10, the above considerations also applying for said PCB board.

As already indicated, the upper die 2 and the lower die 3 are suitably spaced apart by an air gap 6 which allows the contact probes 1 to deform during the operation of the probe head 10 and ensures the contact of tip and contact head, 1A and 1B, of the contact probes 1 with the contact pads, 4A and 5A, of the device under test 4 and of the space transformer 5 or PCB board, respectively. Obviously, the upper guide holes 2A and the lower guide holes 3A must be sized so as to allow a sliding of the contact probe 1 therein during the testing operations performed by means of the probe head 10. It is further important to ensure that the deformation of the probes occurs analogously for each probe of the plurality of probes contained in the probe head 10, so as to avoid possible undesired interferences and contacts between adjacent probes.

The shape of the deformation undergone by the probes and the force required to produce this deformation are dependent on numerous factors, such as the physical characteristics of the material, possibly composite, that makes the probes and the value of the offset between guide holes in the upper guide and corresponding guide holes in the lower guide.

The proper operation of a probe head is basically linked to two parameters: the vertical movement, or overtravel, of the contact probes and the horizontal movement, or scrub, of the contact tips of said contact probes, said scrub allowing the contact tips to superficially scratch the contact pads, thus removing the possible impurities accumulated thereon, for instance in the form of a thin layer or film of oxide, thus improving the contact performed by said contact head by means of said contact probes.

All these features should be evaluated and calibrated in the manufacturing step of the probe head, since the proper electric connection between probes and device under test, in particular between contact tips of the probes and contact pads of the device under test, should always be ensured.

Equally important is to ensure that the pressing contact of the contact tips of the probes onto the contact pads of the device under test is not so high as to cause the probe or the pad itself to break.

This problem is particularly felt in case of the so-called short probes, i.e. probes with rod-shaped body limited in length and in particular with overall dimensions lower than 5000 µm. Probes of this type are used for instance for high-frequency applications, the reduced length of the probes limiting the connected self-inductance phenomenon, which is strongly penalizing in high-frequency applications, this term indicating applications involving signals carried by the probes with frequencies greater than 1000 MHz.

In this case, however, the reduced length of the body of the probes dramatically increases the rigidity of the probe as a whole, which implies an increase in the force exerted by the respective contact tip onto the contact pads of the device under test, which may cause said pads to break, with irreparable damage to the device under test, a situation which is obviously to be avoided. Even more dangerously, the increase in the rigidity of the contact probe due to the reduction of the length of its body increases the risk of breakage of the probes themselves.

To solve these problems, it is known to make probes having one or more openings extended along the related rod-shaped bodies, able to decrease the rigidity of the probes and consequently the pressure exerted by the probes onto the contact pads, meanwhile ensuring a sufficient elasticity of the body of said probes, said openings defining a plurality of arms, substantially parallel to each other in the body of the probes.

In this case, with reference to FIGS. 2A and 2B, a contact probe 1 comprises an opening 12 or a plurality of openings 12a, 12b made at the body 1C thereof and adapted to define a plurality of arms 11a, 11b, 11c. Probes of this type are described for instance in U.S. Pat. No. 7,850,460 granted on Dec. 14, 2010 to Feinmetall GmbH.

Thanks to the presence of openings and arms, the probes made in this way have an increased elasticity and are therefore less subjected to breakage, while ensuring signals having a sufficiently high current value for the concerned applications to be carried.

However, during the operation the probes take up a deformed configuration and show an accumulation of pressure stresses at specific areas that are still prone to breakage.

The technical problem of the present invention is to provide a contact probe having functional and structural features such as to allow the use thereof in any circumstance, and in particular in high frequency applications with probes having a length of less than 5000 µm, having sufficient elasticity and avoiding stress accumulations, and therefore decreasing the risk of breakage, even in a deformed configuration during the testing operations, thus overcoming the limitations and drawbacks still affecting the contact probes and probe heads made according to the prior art.

SUMMARY OF INVENTION

The solution idea underlying the present invention is to provide the contact probes with at least one opening extended along the corresponding rod-shaped bodies, said opening being suitably made so as to define a plurality of arms having a non-constant section along the longitudinal development axis of the probe itself, in particular with different areas at different points along the body of the probe, identified based on the stress generated in said probe body during the deformation thereof during a testing operation.

Based on this solution idea, the technical problem is solved by a contact probe having una first end portion adapted to abut onto a contact pad of a device under test and a second end portion adapted to abut onto a contact pad of a PCB board of a testing apparatus, as well as a probe body extended between said first end portion and said second end portion along a longitudinal development direction and provided with at least one opening extending along said longitudinal development direction and defines at least one pair of arms in said probe body, characterized in that each of the arms of the at least one pair of arms has a transversal section, which is perpendicular to said longitudinal development direction, not constant, with different areas at different points along said probe body.

More particularly, the invention comprises the following additional and optional features, taken singularly or in combination if needed.

According to an aspect of the invention, the probe body may have a pre-deformed shape with a curvilinear configuration in the rest conditions, when the contact probe is not in pressing contact on a contact pad of a device under test.

Suitably, the pre-deformed shape may comprise at least one bend and a curvature change point and the arms may have transversal section of maximum value at the curvature change point.

According to another aspect of the invention, the contact probe may further comprise at least one stopper, formed by a preferably drop-shaped opening and able to define two portions of the probe adapted to get close and away if subjected to transversal compression forces, the stopper being in this way an elastic stopper.

According to another aspect of the invention, the pre-deformed shape of the contact probe may comprise at least one pair of bends, arranged with curvature opposite with respect to the longitudinal development direction.

According to this aspect of the invention, the contact probe may comprise a first bending neck formed at a first end of the probe body and a second bending neck formed at a second end of the probe body, by means of portions of reduced section. In particular, said first and second bending necks may have concave portions arranged symmetrically and preferably each oppositely with respect to a concavity of one of the bends adjacent thereto.

Furthermore, the contact probe may comprise at least one strengthening portion, positioned at an end of the opening.

The contact probe may also comprise an enlarged portion at the contact head portion, having a greater section than a section of the probe body, so as to define an undercut wall of the contact head portion.

Suitably, the contact probe may have an overall longitudinal extension ranging between 2 mm and 5 mm, preferably between 3.8 mm and 4.6 mm, more preferably equal to 2.1 mm in rest conditions, i.e. when said contact probe is not abutting onto a contact pad of a device under test.

The technical problem is also solved by a probe head comprising at least one upper guide provided with upper guide holes and a lower guide provided with lower guide holes to house a plurality of contact probes made as above indicated.

The characteristics and advantages of the contact probe according to the invention will become apparent from the following description of an embodiment thereof, given by way of indicative and non-limiting example, with reference to the attached drawings.

BRIEF DESCRIPTION OF DRAWINGS

In these drawings:

FIGS. 2A and 2B show respective front views of contact probes made according to the prior art;

FIGS. 3 and 3A-3C schematically show respective front and cross sectional views of an embodiment of a contact probe according to the present invention;

FIGS. 4 and 4A-4D, 5 and 5A, 6 and 6A-6C, 7 and 7A-7E, 8 and 8A schematically show respective front and cross sectional views of alternative embodiments of a contact probe according to the present invention;

DETAILED DESCRIPTION OF THE INVENTION

Figure 1:
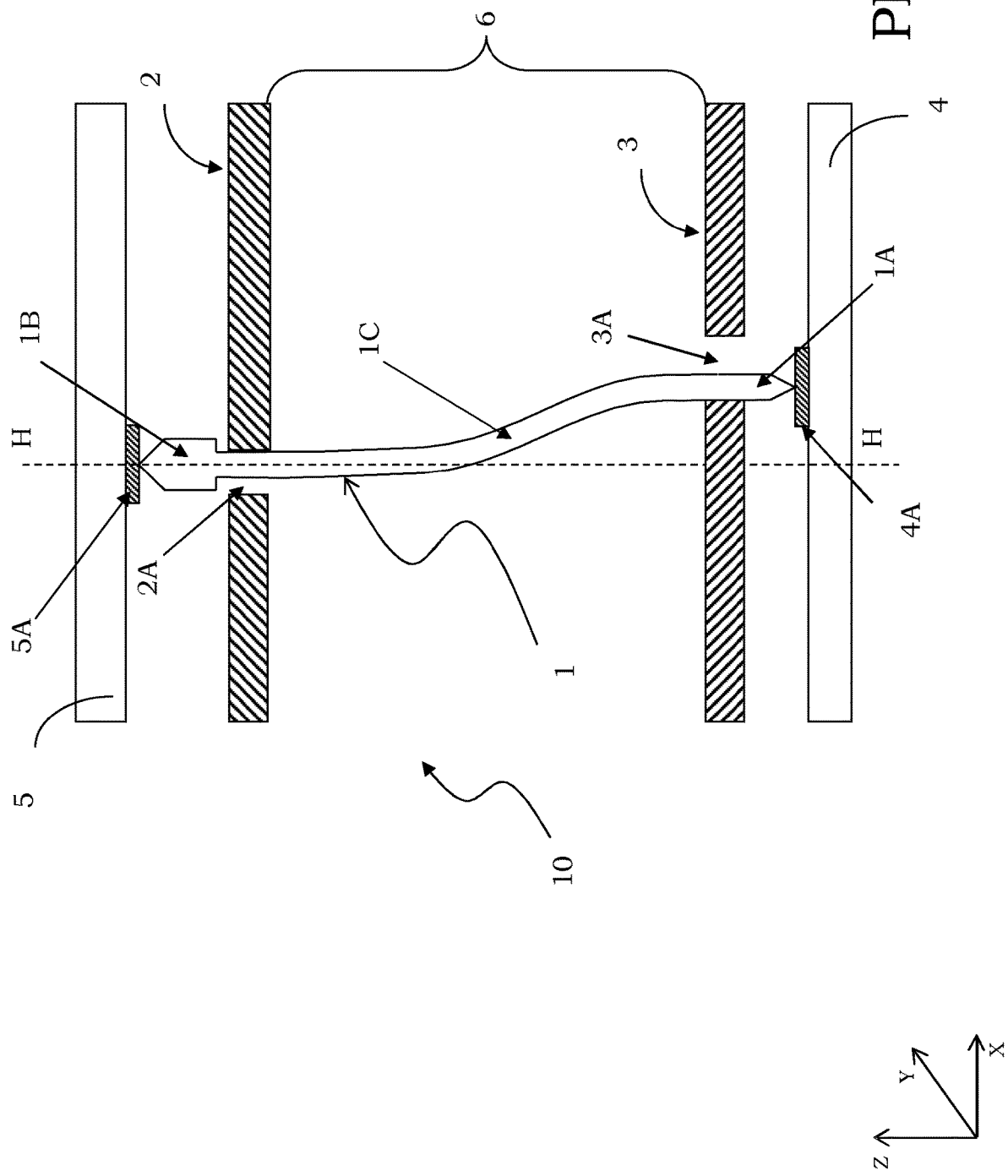
FIG. 1 schematically shows a front view of a probe head made according to the prior art.

With reference to these figures, and in particular to FIGS. 3 and 3A-3C, it is herein described a contact probe made according to the present invention, globally indicated with reference number 20.

It should be noted that the figures represent schematic views and are not drawn to scale, but instead they are drawn so as to enhance the important features of the invention. Furthermore, in the figures, the different pieces are shown schematically since their shape may vary according to the desired application. Furthermore, particular features illustrated in one figure in relation to an embodiment may also be used in one or more of the embodiments illustrated in the other figures.

Finally, elements that are equal in structure and function in the different embodiments illustrated and described in the various figures are indicated with the same alphanumeric references.

The contact probe 20 comprises at last one contact end adapted to abut onto a contact pad of a device under test at a contact tip portion 20A; in the embodiment illustrated in the figures, said contact probe 20 is of the non-blocked type and comprises at least one further contact end adapted to abut onto a contact pad of a PCB board of a testing apparatus (not illustrated) at a contact head portion 20B. The contact probe 20 further comprises a rod-shaped probe body 20C being extended between the contact head portion 20B and the contact tip portion 20A, according to a longitudinal development direction of the probe, in particular the z direction of the local reference of the figure.

Suitably, the contact probe 20 further comprises an opening 22, extending along the probe body 20C, which thus turns out to be formed by at least one first arm 21a and one second arm 21b, substantially parallel to each other, separated by said opening 22.

Advantageously according to the present invention, said first arm 21a and second arm 21b have different transversal section, namely according to planes that are perpendicular to the longitudinal development direction z, at different points of the probe body 20C along said z direction.

More particularly, as indicated in the figure, a first transversal plane positioned at a first point A is identified along the probe body 20C, a second transversal plane positioned at a second point B along the probe body 20C and a third transversal plane positioned at a third point C along the probe body 20C, the term "transversal plane" indicating a plane orthogonal to the longitudinal development direction z, said points being distinct from each other and determined based on the stress generated in the probe body 20C during the testing, as it will be clarified hereinafter.

In a first embodiment, the first point A, the second point B and the third point C are positioned so as to be equally spaced from each other and from the two ends of the opening 22 and thus of the arms 21a, 21b. Suitably, the corresponding transversal sections of the first arm 21a, indicated with Sez Aa, Sez Ba and Sez Ca, as well as preferably the transversal sections of the second arm 21b, indicated with Sez Ab, Sez Bb and Sez Cb, have different dimensions from each other along the probe body 20C, as schematically illustrated in FIGS. 3A-3C. In other words, the contact probe 20 comprises arms which realize its probe body 20C with transversal sections having a non-constant area along the longitudinal development direction z of said probe body 20C and thus of the contact probe 20.

It is immediate to verify that the area variation in the transversal section of the arms along the longitudinal development direction z allows distributing the stress which the contact probe 20 is subjected to during the pressing contact onto the pads of the device under test, thus avoiding accumulations that could cause damage or even breakage thereof.

It is obviously possible to realize contact probes having a probe body 20C crossed by more than one opening 22 and thus provided with more than two longitudinal arms, suitably having transversal sections with an area that is variable along the longitudinal development direction z of the probe body 20C and thus of the contact probe 20.

More particularly, in the embodiment shown in FIG. 3, the contact probe 20 and the arms 21a and 21b thereof have a rectangular section with base L and height H, as well as an area still indicated with Sez. For the sake of simplicity, in the embodiment illustrated in the figure, the first arm 21a and the second arm 21b have the same configuration and transversal sections of equal area at the planes positioned in the several points along the longitudinal development direction z. In other words, for instance at the first transversal plane positioned at the first point A, the first arm 21a has a transversal section Sez Aa having base Laa and height Haa respectively equal to the base Lab and height Hab of the section Sez Ab of the second arm 21b still at the first transversal plane positioned at the first point A; the same also applies for the respective dimensions of base and height and for the respective sections Sez Ba, Sez Bb and Sez Ca, Sez Cb of said first arm 21a and second arm 21b taken at the second transversal plane positioned at the second point B and at the third transversal plane positioned at the third point C along the probe body 20C.

It is obviously possible to also consider the case in which the shape and sectional trend of the first arm 21a with respect to the second arm 21b is not the same along the probe body 20C, though each arm is not constant in section.

Suitably, according to the present invention, the probe body 20C has a pre-deformed shape, in the example illustrated in FIG. 3 a one-bend shape, namely arc-shaped with the curvature change point at the second point B. Said second point B may also be considered the maximum curvature point of the probe body 20C and of its arms 21a, 21b, substantially the vertex of the arch of the pre-deformed bend in the contact probe 20. The one-bend shape of the contact probe 20, in particular of the probe body 20C thereof, is thus also present even in the non-operative conditions of the probe, i.e. before it bends and deforms during the testing.

In this way it is possible to avoid using double guides able to realize an offset of the probes, as it occurs in the known solutions, the one-bend pre-deformation ensuring that the contact probes 20 bend in a same desired direction. In this way the problem linked to the offset caused by the guides in the known solutions is overcome, which offset, in particular in the presence of a large number of contact probes, impresses onto the device under test a transversal force capable of causing undesired displacements thereof.

In particular, the opening 22 forms in the probe body 20C a first arm 21a and a second arm 21b having maximum section (i.e. with maximum area) at a stress accumulation point along said probe body 20C. More particularly, in the example of FIG. 3, the stress accumulation point along the probe body 20C is identified at point B, at the maximum curvature point of the contact probe 20, in particular of the probe body 20C and arms 21a, 21b thereof, namely at the bend curvature change realized in the pre-deformed probe body 20C.

In other words, considering the sections at points A, B and C along the probe body 20C as indicated in FIGS. 3, 3A-3C, the following relations will apply:

for the first arm 21a:$Sez\ Aa < Sez\ Ba$ and $Sez\ Ba > Sez\ Ca$; and for the second arm 21b:$Sez\ Ab < Sez\ Bb$ and $Sez\ Bb > Sez\ Cb$.

In general, for any number of arms, for each arm the following relation will always anyway apply:

$$Sez\ A < Sez\ B; Sez\ B > Sez\ C \qquad (1)$$

i.e. the section at the stress accumulation point B (corresponding to the maximum curvature point of the pre-deformed probe body 20C) is the greatest among the transversal sections of the arms taken in the different points along the probe body 20C of the contact probe 20. In the example in the figure, the variation in section (i.e. in area) is obtained by means of a variation in the value of the base L, whereas the sections keep the same height H, but it is obviously also possible to even provide a variation in height or a simultaneous variation in area and base to obtain the above-reported trend in section (i.e. in area). In general, the overall section of the probe body 20C, meant as the assembly of sections of the arms 21a, 21b and of the opening 22, indicated in FIG. 3A as Sez 20C, is preferably constant along the entire probe body 20C.

More particularly, in the example illustrated in FIG. 3 and in FIGS. 3A-3C, for a rectangular section contact probe 20, the value of the base L of the sections Sez of the arms 21a, 21b ranges between 0.010 mm and 0.020 mm, whereas the value of the height H of said sections Sez is constant and chosen in the range between 0.040 mm and 0.080 mm, preferably equal to 0.041 mm; analogously, the section Sez 20C of the probe body 20C has a base value chosen in the range between 0.060 mm and 0.120 mm, preferably equal to 0.070 mm and a height value equally chosen in the range between 0.040 mm and 0.080 mm, preferably equal to 0.041 mm.

In a preferred embodiment, the second point B is positioned at the center of the probe body 20C and defines therein a first ascending tract 20C1, in the direction of the contact head portion 20B, and a second descending tract 20C2, in the direction of the contact tip portion 20A. Suitably, the first point A and the third point C are positioned in the first ascending tract 20C1 and in the second descending tract 20C2, respectively; advantageously according to the present invention, the first point A and the third point C are at the beginning, respectively at the end of the tracts of the probe body 20C, i.e. of the arms 21a, 21b, with sectional variation of the arms, preferably positioned in the middle of the ascending tract 20C1 and of the descending tract 20C2, respectively.

In the preferred embodiment illustrated in FIG. 3 for a contact probe 20 that is pre-deformed at a bend, the arms 21a, 21b have a section that is constant along the first ascending tract 20C1 of the probe body 20C from the beginning of said first ascending tract 20C1 at the contact head portion 20B up to the first point A, a continuously increasing section from the first point A to the second point B of maximum section and a continuously decreasing section from the second point B to the third point C to then return to have a constant section up to the end of the second descending tract 20C2 at the contact tip portion 20A.

In an embodiment, for a rectangular section contact probe 20, said variable sections are obtained thanks to different values of their bases L and in particular the probe body 20C of the contact probe 20 has a section with a base equal to 0.014 mm from the contact head portion 20B up to the first point A, increasing up to the second point B where it has a base that reaches a value of 0.016 mm and again decreasing up to the third point C where it has a base which returns to have a value of 0.014 mm, which is maintained up to the contact tip portion 20A.

It is possible to verify that the particular configuration of the contact probe 20 according to the present invention, with arms 21a, 21b having a variable section along the probe body 20C and in particular with a section which constantly increases from A to B and constantly decreases from B to C, allows uniformly distributing along said probe body 20C the stress which the contact probe 20 is subjected to upon contact of its contact tip portion 20A onto the contact pads of a device under test during the testing operations performed by means of said contact probe 20.

The contact probe 20 further preferably comprises a thinned configuration at the contact tip portion 20A, which comprises a base portion 23A with a section being equal or comparable to the section of the probe body 20C and contiguous thereto, the term "comparable" meaning that the difference between the two sections is ±20%, and an end portion 24A, contiguous to the base portion 23A and which realizes the real contact tip of the contact probe 20, said contact tip being always indicated with 24A and being adapted to abut onto contact pads of a device under test when the contact probe 20 is used inside a probe head for the testing of integrated devices. Suitably, the contact tip 24A is thinned with respect to the base portion 23A of the contact tip portion 20A, i.e. the contact tip 24A has a section having a value equal to 20-60% of the section of the base portion 23A and thus of the probe body 20C, preferably equal to 50% of the probe body 20C.

In this way, the contact probe 20 is suitable for the testing of a device under test having contact pads with reduced-area, as it occurs in the latest integration technologies. The contact tip 24A may further be sized in length along the longitudinal development direction z, so as to ensure a proper operation of the probe even after several testing operations which, as known, require corresponding cleaning operations, usually performed by means of touch on an abrasive cloth and which involve a gradual shortening of said contact tip 24A.

The contact probe 20 also comprises a thinned configuration at the contact head portion 20B, which comprises a base portion 23B with section equal or comparable to the section of the probe body 20C and contiguous thereto and an end portion 24B which realizes the real contact head of the contact probe 20, still indicated with 24B, thinned with respect to the base portion 23B, i.e. with a section having value equal to 20-60% of the section of the base portion 23B, preferably equal to 50%. Suitably, the contact head portion 20B also comprises an enlarged portion 25, positioned between the base portion 23B and the contact head 24B and having a section that is greater than the base portion 23B and thus the probe body 20C, so as to define an undercut wall of said contact head portion 20B, adapted to abut onto a guide of a probe head comprising the contact probe 20, as it will be illustrated hereinafter. More particularly, the enlarged portion 25 has a section that is greater by 20-40% than the section of the base portion 23B and thus of the probe body 20C, preferably greater by 30% with respect to the section of the probe body 20C. In a preferred embodiment, the contact probe 20 has a rectangular section and the section variations of the different portions thereof are made by means of variations of the value of the base L thereof.

According to an alternative embodiment illustrated in FIG. 4, the contact probe 20 further comprises at least one bending neck 26, positioned at one of the ends of the probe body 20C, preferably as in the example of FIG. 4 at the end of the probe body 20C at the contact tip portion 20A. More particularly, said bending neck 26 is made of a reduced-section portion, preferably having a section that is reduced by 30-60% with respect to section Sez 20C of the probe body 20C, more preferably equal to 50% of the section of the probe body 20C, as schematically illustrated in FIG. 4D, which shows the section of the contact probe 20 taken at a fourth point D with a transversal plane passing at the center of the bending neck 26, i.e. in its minimum section point. Even in this case, as schematically illustrated in FIGS. 4A-4C, the sections of the arms 21a, 21b respect the above-reported relation (1).

In the embodiment illustrated in FIG. 4, the bending neck 26 is preferably arranged at the center of the contact probe 20, concentrically with respect to the base portion 23A of the contact tip portion 20A, along the longitudinal development direction z and is obtained by symmetrically removing material from at least two opposite sides of the contact probe 20, in particular of the contact tip portion 20A thereof.

It is immediate to verify that the presence of the bending neck 26, in particular at one end of the arms 21a, 21b and thus of the opening 22, notoriously an area being greatly prone to breakage, is able to reduce the stress which said arms 21a, 21b are subjected to, in particular during the testing operations, i.e. when the contact probe 20 bends and deforms due to its abutment onto the contact pads of the device under test.

Furthermore, thanks to its central positioning, said bending neck 26 does not negatively affect the bending mechanism of the contact probe 20 and the scrub of the contact tip 24A thereof.

Figure 5A:
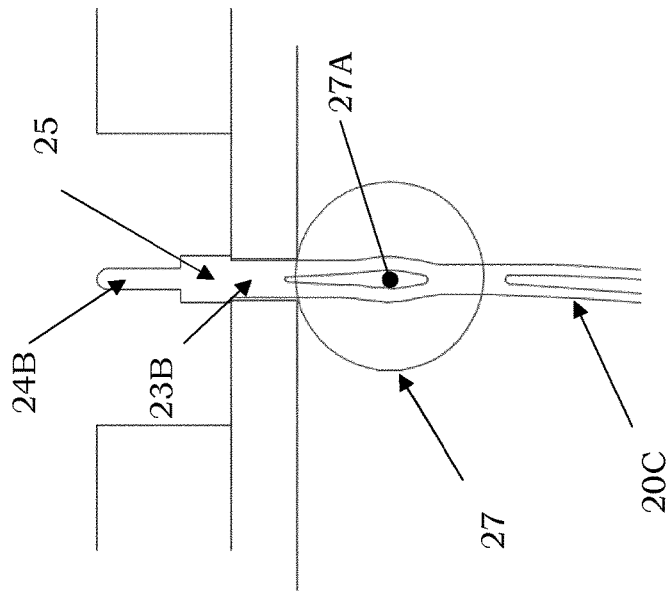
Figure 5:
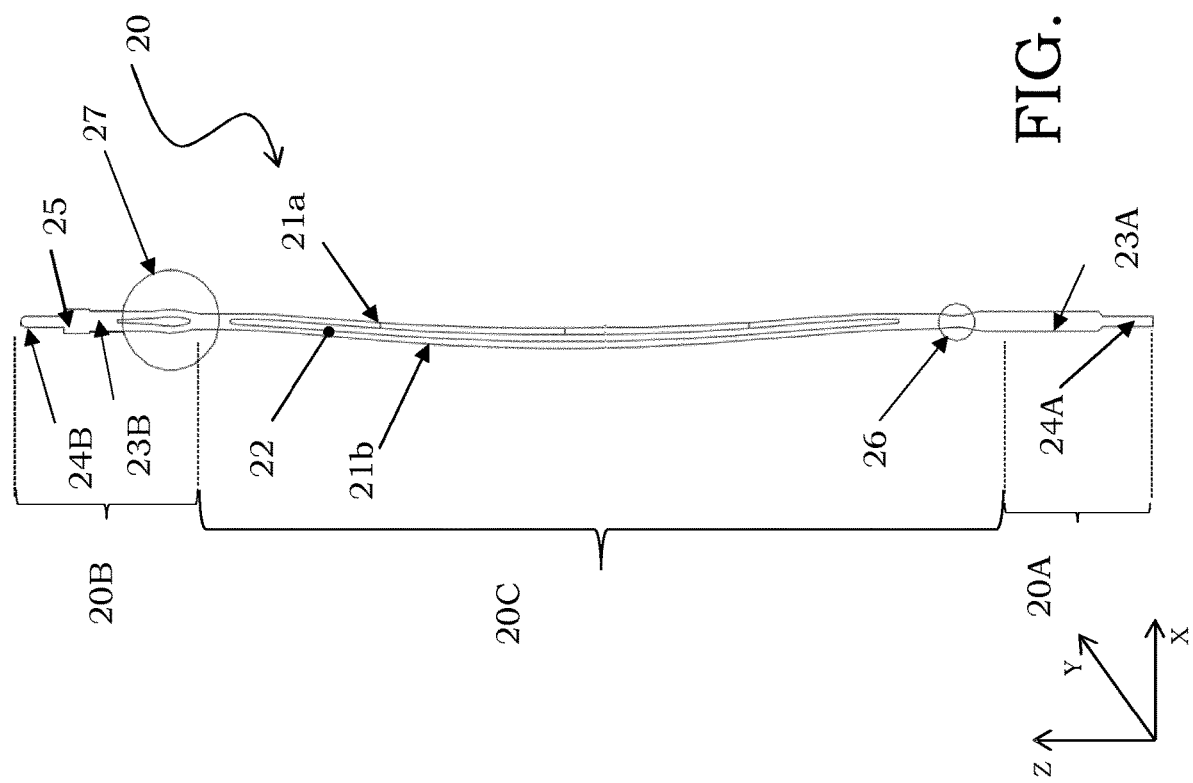

According to a further alternative embodiment, schematically illustrated in FIG. 5, the contact probe 20 comprises a stopper 27, advantageously elastic. More particularly, as schematically shown in the enlargement of FIG. 5A, said stopper 27 is made in the contact head portion 20B of the contact probe 20, preferably in the base portion 23B, by means of a drop-shaped opening 27A, i.e. with increasing dimensions along the base portion 23B of the contact head portion 20B towards the probe body 20C. In this way the stopper 27 has the shape of an eye of a needle, the presence of the drop-shaped opening 27A defining two opposite portions in the base portion 23B, which are able to get close to or away from if subjected to transversal compression forces.

More particularly, the drop-shaped opening 27A is sized so as to enlarge the base portion 23B of the contact head portion 20B up to greater dimensions of a guide hole made in a plate of a probe head that houses the contact probe 20, so as to prevent or at least hinder the movement of the contact probe 20, once inserted into the probe head, upwards, i.e. according to the z direction, considering the local reference of the figure, as it will be better explained hereinafter.

Suitably, the stopper 27 has a symmetric shape, so as to exert a contrast action to a movement of the contact probe 20 with respect to a guide hole wherein it is housed independently of the curvature direction of its pre-deformed shape and in the absence of a pair of guides which realizes an offset thereof, as it occurs in the known solutions.

It is emphasized that the elasticity of the stopper 27 allows the passage of the contact probe 20 in a corresponding guide hole during the assembly operations, as well as the extraction thereof by an operator during possible maintenance operations that require for instance the removal and replacement of the contact probe 20 itself, though ensuring a proper holding even when the probe head housing it is not in a pressing contact on a device under test, said stopper 27 being able to effectively counteract the movement of the contact probe 20 due to the gravity or to other transversal forces, such as during cleaning operations usually performed by means of air jets.

Though the embodiment illustrated in FIG. 5 shows a contact probe 20 provided both with the bending neck 26 and with the stopper 27, it is also possible to make the same so as to only comprise the bending neck 26, as illustrated in FIG. 4, or only the stopper 27.

The contact probe 20 at a bend shown in FIGS. 3, 4 and 5 is suitable for high-frequency applications and may be made with an overall longitudinal extension, indicated in FIG. 3 with Ls, which ranges between 3 mm and 5 mm, preferably between 3.8 mm and 4.6 mm. Said values are meant when the contact probe 20 is in the rest or non-operating conditions, i.e. when it is not abutting on a contact pad of a device under test.

Said dimensional ranges for the overall extension of the contact probe 20 ensure that the same be used for high-frequency applications and maintain an elastic behaviour during the testing, i.e. it bends and compresses during the pressing contact onto the contact pads of a device under test without plastically deforming, that is, not definitively, thus it can be re-used; probes with lengths in said dimensional ranges may however not be sufficient in some types of applications. In particular, the most modern testing technologies may require probes smaller than 3 mm, preferably even smaller than 2.5 mm.

To meet this type of requirements, an alternative embodiment of the contact probe 20, schematically illustrated in FIG. 6, may be used.

Also in this case, the contact probe 20 comprises at least one contact tip portion 20A and one contact head portion 20B, as well as a probe body 20C arranged therebetween. As previously, the probe body 20C is crossed by an opening 22 that defines at least one pair of arms 21a, 21b therein.

Suitably, in this case the probe body 20C has a pre-deformed shape with a double bend trend, the two bends being arranged with opposite curvature with respect to the longitudinal development direction z, a first bend having a curvature change at a first point A' and being joined to a second bend at a second point B', said second bend in turn having a curvature change at a third point C'.

It is immediate to verify that the double bend pre-deformed shape of the contact probe 20 of FIG. 6, which introduces into the probe body 20C deformations in two different modes based on the two different curvatures of the bends, allows distributing the stress on the two bends, thus reducing the concentration thereof.

As previously, advantageously according to the present invention, the arms 21a, 21b have a different transversal section, i.e. according to planes perpendicular to the longitudinal development direction z of the contact probe 20, at different points of the probe body 20C along said direction z. In this case as well by way of example, the contact probe 20 and the arms 21a and 21b thereof have rectangular section with base L and height H, as well as area still indicated with Sez, as illustrated in FIGS. 6A-6C, where the sections of the arms 21a, 21b, Sez A'a, Sez B'a and Sez C'a and of the second arm 21b, Sez A'b, Sez B'b and Sez C'b at points A', B' e C', respectively, are in particular indicated.

Thanks to the presence of the two-bend pre-deformed shape and of the variable section arms, an excellent distribution of the stress along the probe body 20C is obtained, which allows to further reduce the overall length Ls of the contact probe 20.

According to a first embodiment, the section of the arms 21a, 21b has an increasing value from the beginning of the probe body 20C at the contact head portion 20B up to a first curvature change point A' of the first bend or upper bend (considering the local reference of the figure), decreasing up to the second two-bend joining point B', still increasing up to the third curvature change point C' of the second bend or lower bend and still decreasing up to the end of the probe body 20C at the contact tip portion 20A. Preferably, the section of the arms 21a, 21b at the beginning and at the end of the probe body 20C is equal to the section at the second point B' and the sections at the first point A' and third point C' are equal to each other and both greater than the section at the second point B'.

Thus it occurs that, thanks to the presence of the variable section arms 21a, 21b, the stress which the contact probe 20 is subjected to during the testing operations is evenly distributed along its probe body 20C and thus its arms 21a, 21b, thus reducing the risks of deformations or breakage of the contact probe 20 itself. Furthermore, the symmetrical trend of the section variation allows maintaining the kinematic behaviour of the contact probe 20 unaltered when it bends and compresses by abutting onto the contact pads of the device under test, equally not affecting the scrub thereof.

In a preferred embodiment, as schematically illustrated in FIGS. 6A-6C, the contact probe 20 has arms 21a, 21b with a constantly increasing section along the entire probe body 20C, from the beginning at the contact head portion 20B, through the first point A', the second point B' and the third point C', up to the end at the contact tip portion 20A. The following relation for each of the arms 21a, 21b is therefore verified:

$$sez\ A' < sez\ B' < sez\ C' \qquad (2)$$

In this way it is verified that it is possible to make the contact probe 20 with an overall length Ls less than 3 mm, preferably less than 2.5 mm, more preferably equal to 2.1 mm, without undergoing a plastic deformation during the testing operations, the presence of the arms 21a, 21b with a constantly increasing section ensuring a proper distribution of the stress along the probe body 20C when the contact probe 20 is in pressing contact onto the contact pads of a device under test, meanwhile avoiding damages or even breakage of the arms 21a, 21b themselves.

It is obviously possible to make the double-bend contact probe 20 of FIG. 6 even with an overall length Ls greater than 3 mm, in particular with a length analogous to the one-bend embodiment, based on the application needs of the probe itself.

In the example in FIG. 6, the contact probe 20 has a rectangular section and the section variation (i.e. area variation) is obtained by means of a variation of the value of the base L, whereas the sections maintain a same height H and, in a preferred embodiment, the value of said base L is equal to 0.014 mm at the first point A', 0.016 mm at the second point B' and 0.018 mm at the third point C'.

It is also possible to consider to make the contact probe 20 with arms 21a, 21b having a constantly increasing section only in one tract of the probe body 20C rather than along its entire extension, for instance in the tract defined between the first point A' and the third point C' indicated in FIG. 6. In this case, the arms 21a, 21b are made so as to have a constant section that is equal to the section of the first point A' from the beginning of the probe body 20C at the contact head portion 20B up to the first point A', indeed, an increasing section from the first point A' to second point B' and from the second point B' to the third point C' and a still constant section that is equal to the section of the third point C' therefrom up to the end of the probe body 20C at the contact tip portion 20A. In this case as well, the above-indicated relation (2) is respected for each of the arms 21a, 21b.

As previously, it is possible to consider a contact probe 20 having a probe body 20C crossed by several openings 22 and thus provided with more than two arms, as well as arms having a different configuration, in particular sections that are different from one arm to another at a same transversal plane, each of the arms 21a, 21b respecting the above-indicated relation (2).

A further alternative embodiment is schematically illustrated in FIG. 7. The contact probe 20 has a two-bend pre-deformed probe body 20C and comprises at least one bending neck, preferably a first bending neck 26A formed at the end of the probe body 20C and thus of the arms 21a, 21b thereof at the contact tip portion 20A and a second bending neck 26B formed at the beginning of the probe body 20C and thus of the arms 21a, 21b thereof at the contact head portion 20B.

More particularly, said bending necks 26A, 26B are made of reduced-section portions, for instance having a section reduced by 30-60% with respect to the section Sez 20C of the probe body 20C, more preferably equal to 30% of the section of the probe body 20C, as schematically illustrated in FIGS. 7D and 7E, which show the section Sez D' of the contact probe 20 taken at a fourth point D' with a transversal plane passing through the center of the first bending neck 26A and the section Sez E' of the contact probe 20 taken at a fifth point E' with a transversal plane passing through the center of the second bending neck 26B. In this case as well, as schematically illustrated in FIGS. 7A-7C, the sections of the arms 21a, 21b respect the above-reported relation (2).

More particularly, the bending necks 26A and 26B are made so as to have concave portions arranged symmetrically and in particular opposite with respect to the concavities of the bends adjacent thereto.

In this way the presence of the bending necks 26A and 26B is able not only to reduce the stress which said arms 21a, 21b are subjected to, in particular during the testing operations, namely when the contact probe 20 bends and deforms due to its abutment onto the pads of the device under test, but it also allows forcing the bending of the contact probe 20 itself consistently with the double-bend shape of the probe body 20C thereof.

Figure 8A:
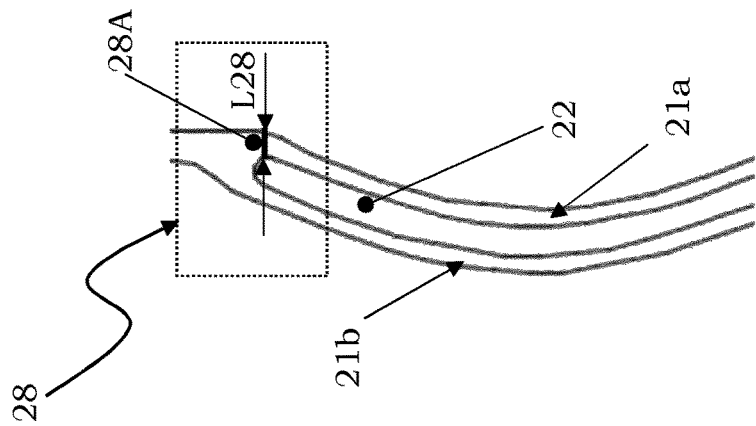
Figure 8:
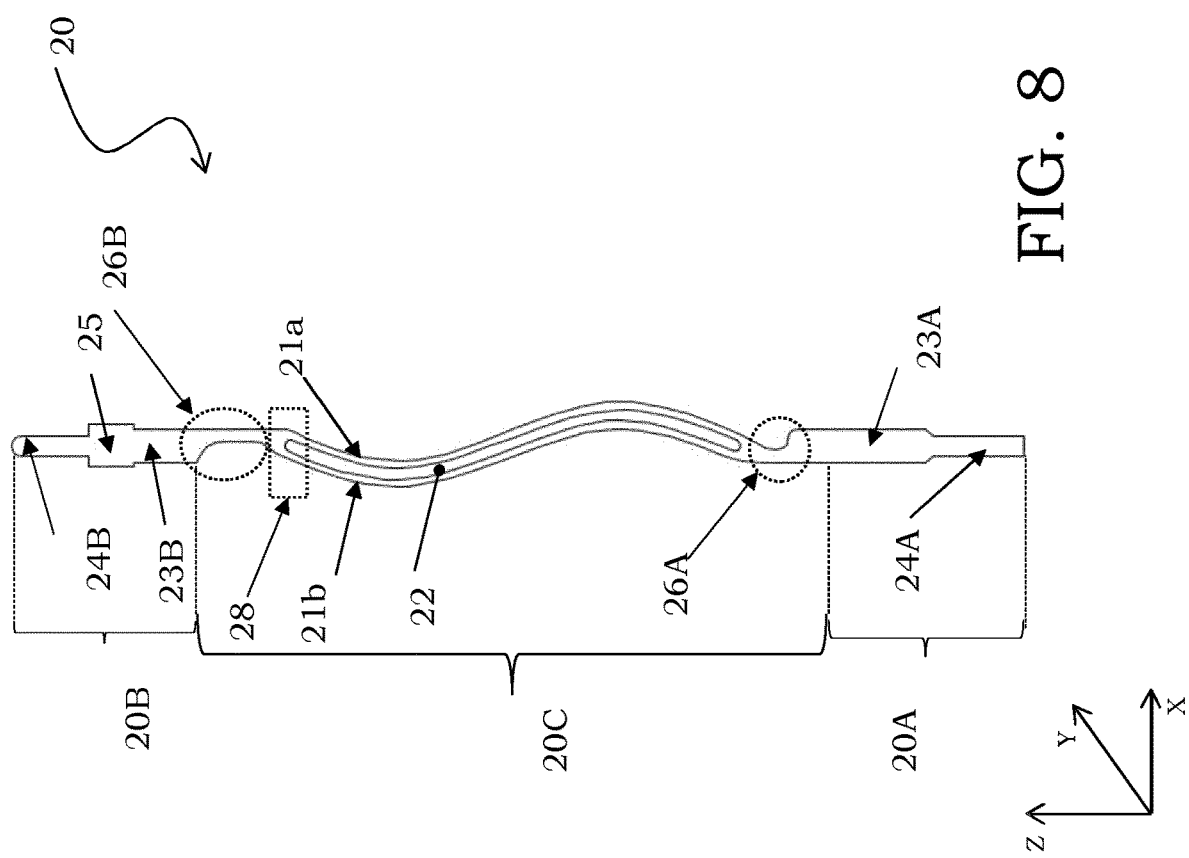

According to another alternative embodiment, schematically illustrated in FIG. 8, the contact probe 20 comprises a strengthening portion 28, positioned at an end of the opening 22 and thus of the arms 21a, 21b, preferably at the contact head portion 20B.

More particularly, as schematically illustrated in the enlargement of FIG. 8A, at said strengthening portion 28 at least one of the arms 21a, 21b, preferably the first arm 21a in a position opposite with respect to the concavity of the first bending neck 26A, has at least one portion 28A having a greater section with respect to the rest of the first tract of the first arm 21a, between the beginning of the probe body 20C, namely of the first arm 21a itself and the concavity-change first point A of the first bend. Preferably, considering a rectangular-section contact probe 20, said greater section portion 28A comprises a base L28 having a value greater by 30-60%, preferably equal to 50% of the base of the section of the first tract of the first arm 21a.

In this case as well, though the embodiment illustrated in FIG. 8 shows a contact probe 20 provided both with the bending necks 26A, 26B and with the strengthening portion 28, it is also possible to make the same so as to comprise just one bending neck 26A or 26B, both the bending necks 26A and 26B (as illustrated in FIG. 7), or just one bending neck 26A and/or 26B and the strengthening portion 28, or yet just the strengthening portion 28.

The present invention also refers to a vertical probe type probe head, comprising at least one pair of guides provided with housing holes of a plurality of contact probes made as above illustrated.

Figure 9:
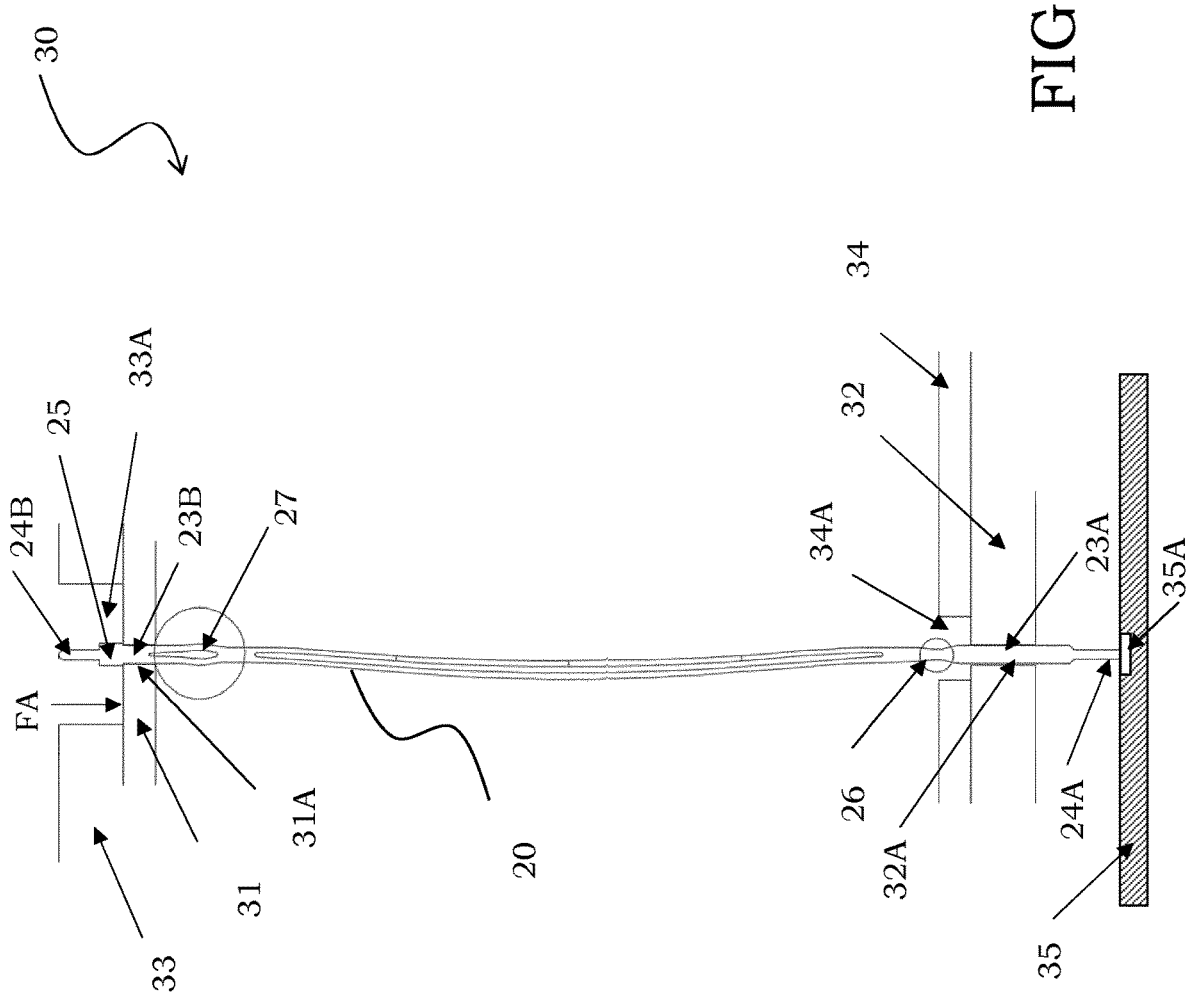
FIG. 9 schematically shows a probe head comprising contact probes according to an alternative embodiment of FIG. 5.

More particularly, with reference to FIG. 9, it is herein described a probe head 30 comprising a plurality of probes made according to the embodiment illustrated in FIG. 5, namely one-bend pre-deformed contact probes. For the sake of simplicity of illustration, in FIG. 9 just one contact probe 20 is shown.

The probe head 30 comprises at least one first plate-like guide or upper guide 31, commonly indicated as upper die, provided with suitable upper guide holes 31A for housing the contact probes 20, as well as a second plate-like guide or lower guide 32, commonly indicated as lower die, also provided with suitable lower guide holes 32A for housing the contact probes 20. As seen in connection to the prior art, the upper die 31 and the lower die 32 are spaced from each other so as to define an air gap therebetween where the contact probes 20 are free to bend during the pressing contact of their contact tip portions 20A onto a pad 35A of a device under test 35.

Suitably, the probe head 30 also comprises an upper frame 33, associated with the upper guide 31 and provided with respective openings 33A suitable for housing the contact probes 20 and a lower frame 34, associated with the lower guide 32 and equally provided with openings 34A for housing the contact probes 20.

More particularly, the upper frame 33 is fixedly connected to the upper guide 31 thanks to the use of connection elements such as screws, pins, or elastic films and the lower frame 34 is similarly fixedly connected to the lower guide 32 still by means of connection elements such as screws, pins, or elastic films. The upper frame 33 and the lower frame 34 act like structural reinforcement elements of the upper guide 31 and of the lower guide 32, respectively, as well as like an alignment tool of the contact probes 20 during the assembly step of the probe head 30.

As shown in FIG. 9, the contact probe 20 is housed or integrated in the probe head 30, so that between the base portion 23B of the contact head portion 20B thereof is inserted in a guide hole 31A of the upper guide 31 with the enlarged portion 25 abutting with its undercut wall onto an upper face FA of said upper guide 31, namely the face of the upper guide 31 facing towards the upper frame 33, in this way acting as a holding element of the contact probe 20 to prevent a movement downwards thereof, in a direction opposite the z axis indicated in FIG. 9.

In particular, the guide hole 31A of the upper guide 31 is sized so as to house with clearance the base portion 23B of the contact head portion 20B of the contact probe 20 but to prevent the passage of the enlarged portion 25, whereas the opening 33A of the upper frame 33 has suitable dimensions for housing both the enlarged portion 25 and the contact head 24B of the contact probe 20.

Furthermore, advantageously according to the invention, the contact probe 20 is housed in the probe head 30 so that the stopper 27 thereof is positioned below the upper guide hole 31A of the upper guide 31, so as to prevent or at least hinder a movement of the contact probe 20 upwards, in direction of the z axis indicated in FIG. 9.

The contact probe 20 further has the base portion 23A of the contact tip portion 20A housed in the lower guide hole 32A of the lower guide 32. In this case as well, said lower guide hole 32A is sized so as to house with clearance the base portion 23A of the contact tip portion 20A of the contact probe 20, whereas the contact tip 24A protrudes below the lower guide 32 towards the device under test 35, so as to abut onto a contact pad 35A thereof. Suitably, the contact probe 20 also comprises a bending neck 26, positioned at the end of the probe body 20C at the base portion 23A of the contact tip portion 20A and housed at the opening 34A made in the lower frame 34.

Figure 10:
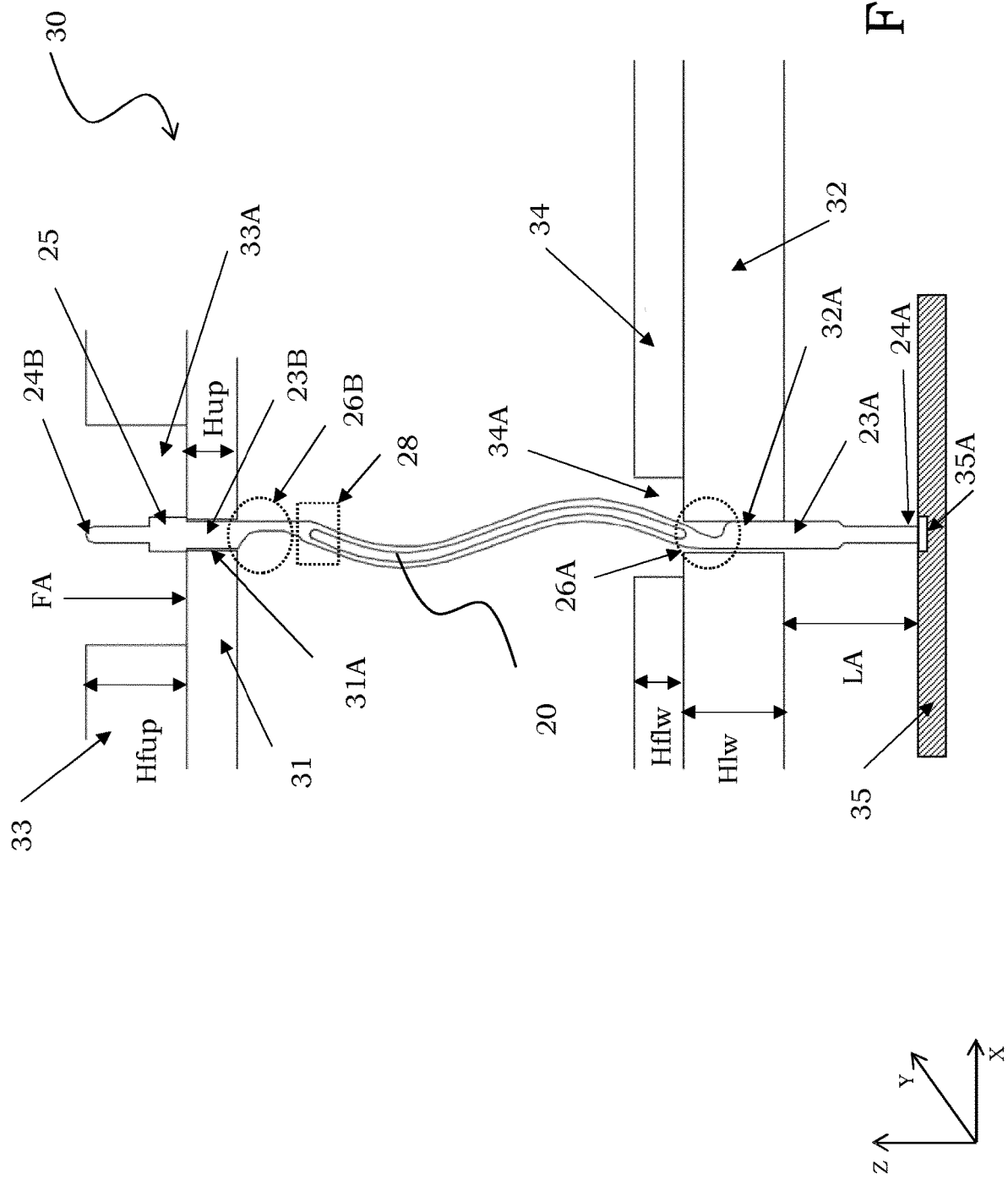
FIG. 10 schematically shows a probe head comprising contact probes according to the alternative embodiment of FIG. 8.

It is also possible to make the probe head 30 by housing therein a plurality of contact probes 20 made according to the embodiment of FIG. 8, namely two-bend pre-deformed contact probes, as schematically shown in FIG. 10, where, for the sake of simplicity of illustration, just one contact probe 20 is shown.

In this case as well, the probe head 30 comprises an upper guide 31 provided with upper guide holes 31A and associated with an upper frame 33 provided with respective openings 33A, the upper guide 31 being spaced with respect to a lower guide 32 provided with lower guide holes 32A and in turn associated with a lower frame 34 provided with respective openings 34A.

The contact probe 20 is housed in the probe head 30, so that the base portion 23B of the contact probe 20 is housed with clearance in an upper guide hole 31A of the upper guide 31, its enlarged portion 25 being housed, together with the contact head 24B, in the corresponding opening 33A of the upper frame 33, so as to abut with its undercut wall on the upper face FA of said upper guide 31. Analogously, the base portion 23A of the contact tip portion 20A is housed with clearance in a corresponding lower guide hole 32A of the lower guide 32, the contact tip 24A protruding from said lower guide 32 in direction of the device under test 35, so as to abut onto a contact pad 35A thereof.

Suitably according to the present invention, the contact probe 20 is housed in the probe head 30, so that its second bending neck 26B is positioned below the upper guide 31.

Furthermore, the lower guide 32 is suitably sized so as to assist the movement of the contact probes 20 in overdrive during the testing operations when said probes are abutting onto the device under test 35.

In this case, suitably according to the present invention, the first bending neck 26A of the contact probe 20 is positioned inside the lower guide hole 32A of the lower guide 32.

More particularly, the lower guide 32 has a thickness Hlw along the longitudinal development direction z that is greater than the thickness Hup of the upper guide 31, preferably equal to 1.8-2 times the thickness Hup of the upper guide 31. In a preferred embodiment, the upper guide 31 has a thickness Hup that varies from 0.100 mm to 0.150 mm, preferably equal to 0.125 mm, whereas the lower guide 32 has a thickness Hlw that varies from 0.150 mm to 0.300 mm, preferably equal to 0.254 mm.

Suitably according to the embodiment illustrated in FIG. 10, the upper frame 33 has a thickness Hfup comparable, preferably equal to the thickness Hlw of the lower guide 32 and the lower frame 34 has a thickness Hflw comparable, preferably equal to the thickness Hup of the upper guide 31, the term "comparable" meaning that the difference between the two thicknesses is ±20%.

In this way, the assembly of the upper guide 31 and upper frame 33 has a thickness that is comparable, preferably equal to the assembly of the lower guide 32 and lower frame 34, so as to ensure symmetry of dynamic and elastic behavior of the contact probe 20 and probe head 30 as a whole.

In conclusion, the contact probe provided with at least one opening extending along the probe body thereof and adapted to define at least one pair of arms with non-constant transversal section along the probe body has a better distribution of the stress along said probe body during the pressing contact of said probe onto corresponding pads of a device under test, thus drastically decreasing the chances of probe breakage, in particular of the arms of its probe body and ensuring meanwhile a proper bending of said body, besides a proper holding of the probes inside a corresponding probe head. In this way it is possible to make probes with particularly short overall lengths and thus suitable for applications in the most recent technologies, for instance for very high-frequency applications without risking to modify these probes in a plastic or permanent way.

The contact probe according to the present invention allows overcoming the drawbacks of the known solutions linked to the use of double guides to make an offset of the probes, which, in particular in the presence of a large number of contact probes, impresses a transversal force capable of causing undesired movements on the device under test.

Furthermore, the presence of a double-bend pre-deformed shape, which introduces deformations with two different curvatures into the probe body, allows distributing the stress on the two bends, thus reducing the concentration thereof and, combined with the use of variable-section arms, allows reaching an optimal distribution of the stress along the probe body, which allows the further reduction of the overall length of the probe itself up to values not obtainable with the known solutions.

Suitably, the presence of bending necks made at ends of said probe body favors the bending of the probe itself in a pre-determined direction and further reduces the possibilities of undesired plastic deformations of the arms thereof during the testing operations.

Analogously, the presence of a strengthening portion in areas prone to breakage, increases the robustness of the probes made in this way.

Finally, the probes may be provided with proper elastic stoppers, in addition to enlarged head portions to ensure the proper holding in the probe head.

As already indicated, the elasticity of the stopper allows the passage of the contact probe in a respective guide hole during the assembly operations, as well as the extractions thereof by an operator during possible maintenance operations, though ensuring a proper holding inside the probe head, thus effectively counteracting its movement due to gravity.

Obviously, a person skilled in the art, in order to meet contingent and specific requirements, may make to the above-described contact probe and probe head numerous modifications and variations, all included in the scope of protection of the invention as defined by the following claims.

In particular, it is possible to consider any number of longitudinal openings to form any number of arms in the probe body; moreover it is possible to make the probe with a different number of bends, even if not illustrated in the figures.

Finally, it is possible to provide the contact probe of the present invention with further elements, such as stoppers protruding from the probe body, in addition to other geometric configurations of the tip and head contact portions.

The invention claimed is:

1. A contact probe comprising:
   a first end portion adapted to abut onto a contact pad of a device under test;
   a second end portion adapted to abut onto a contact pad of a PCB board of a testing apparatus,
   a probe body extended between the first end portion and the second end portion along a longitudinal development direction and provided with at least one opening extending along the longitudinal development direction and
   at least one pair of arms being defined in the probe body by the at least one opening,
   wherein each of the arms of the at least one pair of arms has a transversal section, perpendicular to the longitudinal development direction, and the transversal section has an area that constantly changes along the longitudinal development direction of the probe body.

2. The contact probe of claim 1, wherein the probe body has a pre-deformed shape with a curvilinear configuration in rest conditions, when the contact probe is not in pressing contact onto a contact pad of a device under test.

3. The contact probe of claim 2, wherein the pre-deformed shape comprises at least one bend in the form of an arch with a curvature change point and the arms have transversal section area of maximum value at the curvature change point, the curvature change point being a vertex of the arch of the at least one bend.

4. The contact probe of claim 3, wherein the arms have a constantly growing transversal section area starting from a first end of the arms up to the curvature change point and constantly decreasing starting from the curvature change point up to a second end of the arms.

5. The contact probe of claim 2, wherein the pre-deformed shape comprises at least a first bend and a second bend, arranged with curvature opposite with respect to the longitudinal development direction,
the first bend having a curvature change at a first point and being joined to the second bend at a second point, and
the second bend having in turn a curvature change at a third point.

6. The contact probe of claim 5, wherein the arms have a transversal section area which constantly grows starting from a first end of the arms up to the first curvature change point and constantly decreases starting from the first point up to the second point, the transversal section area growing again up to the third point and decreasing again up to a second end of the arms.

7. The contact probe of claim 5, wherein the arms have a constantly growing transversal section area along the probe body comprising the first bend and the second bend, the constantly growing transversal section area starting from a first end of the arms along the first point, the second point and the third point up to a second end of the arms.

8. The contact probe of claim 5, wherein the arms have a transversal section area that is variable only along a portion of the probe body defined between the first point and the third point and comprising the second point, the transversal section area being constant from a first end of the arms up to the first point, constantly growing starting from the first point up to the second point and from the second point up to the third point and constant from the third point up to a second end of the arms.

9. The contact probe of claim 5, further comprising:
a first bending neck formed at a first end of the probe body in correspondence of the contact tip portion, and
a second bending neck formed at a second end of the probe body in correspondence of the second end portion, by means of portions having a reduced section, the reduced section being reduced by between 30-60% with respect to a section of the probe body.

10. The contact probe of claim 9, wherein the first bending neck and the second bending neck have concave portions arranged symmetrically with respect to a concavity of one of the bends adjacent thereto.

11. The contact probe of claim 9, further comprising at least one strengthening portion, positioned at an end of the opening and at least one of the arms having a portion with a larger section area than a portion of the arm in correspondence of the end of the opening.

12. The contact probe of claim 1, further comprising at least one bending neck made at an end of the probe body by means of a portion having a reduced section, the reduced section having a value between 30-60% with respect to a section of the probe body.

13. The contact probe of claim 1, further comprising at least one stopper, formed by an opening made in the second end portion, the opening being drop-shaped and defining two opposite portions in the second end portion able to get close and away if subjected to transversal compression forces, the stopper being an elastic stopper.

14. The contact probe of claim 1, wherein the arms have rectangular transversal sections and the variable transversal sections are obtained by means of variation of a dimension of a base of the rectangular transversal sections.

15. The contact probe of claim 1, comprising a contact tip portion including:
a base portion having a section area which is equal or comparable to a section area of the probe body, comparable meaning that a difference between the section area of the base portion and the section area of the probe body is +20% the section area of the probe body, and
an end tip of reduced section area relative to the section area of the base portion.

16. The contact probe of claim 1, comprising a contact head portion including:
a base portion having a section area which is equal or comparable to a section area of the probe body, comparable meaning that a difference between the section area of the base portion and the section area of the probe body is ±20% the section area of the probe body, and
an end tip of reduced section area relative to the section area of the base portion.

17. The contact probe of claim 1, wherein the second end portion comprises an enlarged portion, having a section greater than the section of the probe body and defining an undercut wall of the second end portion.

18. The contact probe of claim 1, having an overall longitudinal extension ranging between 2 mm and 5 mm in rest conditions when the contact probe is not abutting onto a contact pad of a device under test.

19. A probe head for testing a functionality of a device under test comprising:
a plurality of contact probes
an upper guide provided with upper guide holes, and
a lower guide provided with lower guide holes,
the upper guide holes and lower guide holes housing the plurality of
each contact probe comprising
a first end portion adapted to abut onto a contact pad of a device under test;
a second end portion adapted to abut onto a contact pad of a PCB board of a testing apparatus; and
a probe body extended between the first end portion and the second end portion along a longitudinal development direction and provided with at least one opening extending along the longitudinal development direction;
at least one pair of arms being defined in the probe body by the at least one opening,
wherein each of the arms of the at least one pair of arms has a transversal section, perpendicular to the longitudinal development direction, and the transversal section has an area that constantly changes along the longitudinal development direction of the probe body.

20. The probe head of claim 19, wherein the probe body of each contact probe has a pre-deformed shape with a curvilinear configuration in rest conditions, when the contact probe is not in pressing contact onto a contact pad of a device under test.

21. The probe head of claim 20, wherein the pre-deformed shape of the contact probe comprises at least one bend in the form of an arch with a curvature change point and the arms have transversal section area of maximum value at the curvature change point, the curvature change point being a vertex of the arch of the at least one bend.

22. The probe head of claim 19, wherein each contact probe further comprises at least one bending neck made at an end of the probe body by means of a portion having a reduced section, the reduced section having a value between 30-60% with respect to a section of the probe body.

23. The probe head of claim 19, wherein each contact probe further comprises at least one stopper, formed by an opening made in the second end portion, the opening being drop-shaped and defining two opposite portions in the second end portion able to get close and away if subjected to transversal compression forces, the stopper being an elastic stopper.

24. The probe head of claim 19, wherein each contact probe comprises a contact tip portion comprising:
   a base portion having a section area which is equal or comparable to a section area of the probe body, comparable meaning that a difference between the section area of the base portion and the section area of the probe body is ±20% the section area of the probe body, and
   an end tip of reduced section area relative to the section area of the base portion.

25. The probe head of claim 19, wherein each contact probe comprises a contact head portion having comprising:
   a base portion having a section area which is equal or comparable to a section area of the probe body, comparable meaning that the difference between the section area of the base portion and the section area of the probe body is ±20% the section area of the probe body,
   an end tip of reduced section area relative to the section area of the base portion, and
   an enlarged portion, having a section area greater than the section area of the probe body and defining an undercut wall of the contact head portion.

* * * * *